United States Patent
Nakura et al.

(10) Patent No.: US 8,560,923 B2
(45) Date of Patent: Oct. 15, 2013

(54) SEMICONDUCTOR MEMORY DEVICE

(75) Inventors: Mitsuru Nakura, Osaka (JP);
Nobuyoshi Awaya, Osaka (JP); Kazuya Ishihara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 33 days.

(21) Appl. No.: 13/416,144

(22) Filed: Mar. 9, 2012

(65) Prior Publication Data

US 2012/0266043 A1    Oct. 18, 2012

(30) Foreign Application Priority Data

Apr. 12, 2011 (JP) ................................ 2011-088400

(51) Int. Cl.
*G11C 29/00* (2006.01)
*G11C 7/10* (2006.01)
*H01L 29/06* (2006.01)

(52) U.S. Cl.
USPC ........... 714/763; 714/805; 257/5; 365/189.04

(58) Field of Classification Search
USPC ......... 714/763, 769, 770, 758, 546, 733, 734, 714/799, 800, 805, 718, 721; 365/148, 200, 365/201, 189.011, 189.04, 189.14–189.16; 257/5, 314, 315, 316
See application file for complete search history.

(56) References Cited

U.S. PATENT DOCUMENTS

| | | | |
|---|---|---|---|
| 6,815,744 B1 | 11/2004 | Beck | |
| 7,944,731 B2* | 5/2011 | Chen et al. | 365/148 |
| 7,952,917 B2* | 5/2011 | Xi et al. | 365/158 |
| 2009/0319870 A1 | 12/2009 | Yamada | |
| 2012/0155149 A1* | 6/2012 | Maejima et al. | 365/148 |

FOREIGN PATENT DOCUMENTS

| | | |
|---|---|---|
| JP | 2002-537627 | 11/2002 |
| JP | 2010-0003348 | 1/2010 |

OTHER PUBLICATIONS

Baek et al., "Highly Scalable Non-volatile Resistive Memory using Simple Binary Oxide Driven by Unipolar Voltage Pulses", *IEDM 2004*, (2004), pp. 587-590.

* cited by examiner

*Primary Examiner* — Christine Tu
(74) *Attorney, Agent, or Firm* — Nixon & Vanderhye, P.C.

(57) ABSTRACT

The invention realizes a semiconductor memory device that can efficiently execute a detection of a data error that might possibly occur in a continuous reading action, and a correction of the error data. The semiconductor memory device uses a variable resistive element made of a metal oxide for storing information. During a reading action of coded data with an ECC in the semiconductor memory device, when a data error is detected by an ECC circuit, a writing voltage pulse having a polarity opposite to a polarity of a reading voltage pulse is applied to all memory cells from which the error is detected so as to correct bits from which the error is detected, on an assumption that an erroneous writing has occurred due to the application of the writing voltage pulse having the polarity same as the polarity of the applied reading voltage pulse.

8 Claims, 12 Drawing Sheets

SEMICONDUCTOR MEMORY DEVICE

CROSS REFERENCE TO RELATED APPLICATION

This Nonprovisional application claims priority under 35 U.S.C. §119(a) on Patent Application No. 2011-088400 filed in Japan on Apr. 12, 2011 the entire contents of which are hereby incorporated by reference.

BACKGROUND OF THE INVENTION

1. Field of the Invention

The present invention relates to a semiconductor memory device including a memory cell array that includes a plurality of memory cells in a row direction and a column direction, respectively, wherein each of the memory cells includes a variable resistive element storing information based upon an electric operating characteristic in which an electric resistance changes due to application of an electric stress.

2. Description of the Related Art

A non-volatile memory represented by a flash memory has widely been used for a computer, communication, measuring device, automatic control device, and device for daily use in a personal life, as a high-capacity and compact information recording medium. A demand for an inexpensive and high-capacity non-volatile memory has been extremely increased. The reason of this is as follows. Specifically, the non-volatile memory is electrically rewritable, and further, data is not erased even if a power supply is turned off. From this viewpoint, it can exhibit a function as a memory card or a cellular phone that is easy to carry, or a data storage or a program storage that stores data as an initialization upon starting a device in a non-volatile manner.

However, in the flash memory, it takes time to perform an erasing action of erasing data to a logical value "1", compared to a programming action for programming a logical value "0". Therefore, the flash memory cannot be operated with high speed. The erasing action is performed on a block basis in order to speed up the action. However, there arises a problem that writing by random access cannot be performed, since the erasing action is performed on a block basis.

In view of this, a novel non-volatile memory alternative to the flash memory has widely been studied in recent years. A resistance random access memory utilizing a phenomenon in which a resistance is changed through application of voltage to a metal oxide film is more advantageous than the flash memory in microfabrication limit. The resistance random access memory can also operate at low voltage, and can write data with high speed. Therefore, research and development have actively been made in recent years (e.g., see Japanese Unexamined Patent Publication No. 2002-537627, or Baek, I. G. et al, "Highly Scalable Non-volatile Resistive Memory using Simple Binary Oxide Driven by Asymmetric Unipolar Voltage Pulses", IEDM 2004, pp. 587-590, 2004).

As for programming and erasing characteristics of the variable resistive element having the metal oxide film, an electric resistance of the element increases (high resistance state) or decreases (low resistance state) through application of a voltage pulse having a reverse polarity to the element, in a driving method called bipolar switching. Therefore, the variable resistive element is used as a memory by applying a logical value to the respective electric resistance states as data.

Since the programming and erasing actions can be performed at low voltage with high speed, the memory using the variable resistive element having the metal oxide can write an optional address with high speed. Therefore, the data, which has conventionally been developed and used on a DRAM, can be used on the non-volatile memory. Accordingly, a reduction in power consumption and improvement in usability of a mobile device can be expected.

On the other hand, there are problems to be solved, caused by the property unique to the resistance random access memory.

In order to use a semiconductor memory device as a memory, an action of reading the written data is essential. For example, in order to use, as information, the data on which one of a logical value "0" and a logical value "1" is written, one of the logical value "0" and the logical value "1" has to be correctly read at all times, except when the data is rewritten.

On the other hand, on a memory using a variable resistive element having a metal oxide, data is stored as a resistance state of the variable resistive element having two terminals. Therefore, the programming and erasing for changing the resistance state of the variable resistive element, and the reading of the resistance state must be controlled only by a magnitude of the voltage applied between the two terminals. It is desirable that there is a sufficient difference between the voltage for the programming and erasing actions and the voltage for the reading action in order to prevent erroneous writing of the data by the reading action.

As the microfabrication and integration of the element progress, the reduction in voltage and current used for the programming action and the erasing action is required. On the other hand, it is difficult to remarkably reduce the reading current in order to realize a high reading speed. Accordingly, it becomes difficult to generate a sufficient difference between the programming voltage and the erasing voltage, and the reading voltage.

The number of elements to be mounted is increased due to a high capacity of a memory, whereby a possibility of the erroneous writing of the data during the reading action increases.

When data is continuously read from a specific memory cell without being rewritten during the reading action, there may be a case in which a resistance value is changed gradually or at a certain timing, and erroneous data is outputted when a next reading action is performed, whereby erroneous information is outputted. This phenomenon is referred to as "reading disturb" below.

As a countermeasure for the erroneous writing, a method called ECC (Error Checking and Correcting) has widely been used for a flash memory or a storage disk for enhancing reliability during the reading action. In this method, an error data is detected, and the data from which an error is detected is inverted, corrected, and outputted.

However, when the erroneous writing is caused on the data during the reading action, a bit to which erroneous writing is made is accumulated and increased during the continuous reading action, even if only the output of the reading is corrected. Consequently, the number of bits to which an erroneous writing is made might exceed the limit that can be detected and corrected in the ECC.

Japanese Unexamined Patent Publication No. 2010-3348 proposes a method of correcting not only an output but also data of a memory cell, when a data error is detected, for example.

When the data written in the memory cell is rewritten and corrected every time an error is detected, this process greatly affects a data reading speed of a memory system and deteriorates the performance, in the case where the programming and erasing actions are slower than the reading action by many digits as in the flash memory.

Further, in order to correct the reading output, the read data only needs to be inverted. However, when the data in the memory cell is corrected, the writing action of the variable resistive element is necessary, and its process is complicated. Specifically, when the data written in the memory cell is to be corrected in the case where an error is detected, it is necessary to determine what the error data is. Supposing a memory cell to which a logical value "1" (e.g., corresponding to a high resistance state) and a logical value "0" (e.g., corresponding to a low resistance state) can be written, it is necessary to determine what the data error is. Specifically, it has to be determined whether the error is such that the data to which the logical value "1" is originally written is changed to the logical value "0", or the error is such that the data to which the logical value "0" is originally written is changed to the logical value "1". Thus, in order to correct the data, the time for determining which error is caused is required.

Further, the application condition of a voltage on a circuit greatly differ between the case where the logical value "1" is written over "0" and the case where the logical value "0" is written over "1". Therefore, after the state is determined, more time is taken to set the voltage application state for a desired writing action to the memory cell that is a target of the writing action.

In the above description, the logical value "1" is set as the "high resistance state", and the logical value "0" is set as the low resistance state. However, the same is applied in the case where the logical value "1" is set as the low resistance state, and the logical value "0" is set as the high resistance state.

SUMMARY OF THE INVENTION

In view of the above-mentioned conventional problems, the present invention aims to provide a semiconductor memory device that can efficiently correct data, when a data error, which is possibly generated during a continuous reading action, is detected and corrected.

The present invention utilizes a characteristic of a variable resistive element having a metal oxide described below, thereby simplifying a writing process for correcting a data error of a memory cell.

A variable resistive element is fabricated. The variable resistive element includes a variable resistor having an upper electrode (Ta), a lower electrode (TiN), and an Hf oxide film (3 nm) between the upper electrode and the lower electrode. A reading voltage pulse (0.7 V, 100 nsec) having a polarity same as that of a writing voltage pulse (1.8 V, 50 nsec) for writing the variable resistive element from a high resistance state to a low resistance state is continuously applied to the variable resistive element so as to make a first reading action. FIGS. 8 and 9 illustrate a reading disturb characteristic of the low resistance state, and the high resistance state of 5-bit variable resistive element in this case. Specifically, FIG. 8 is a graph illustrating the number of times of the application of the reading voltage pulse and a change in the resistance value of the variable resistive element, when the reading voltage pulse is continuously applied without applying the writing voltage pulse in the case where the variable resistive element is in the low resistance state. FIG. 9 is a graph illustrating the number of times of the application of the reading voltage pulse and a change in the resistance value of the variable resistive element, when the reading voltage pulse is continuously applied without applying the writing voltage pulse in the case where the variable resistive element is in the high resistance state.

As shown in FIG. 8, a great resistance change is not generated even if the reading action is continuously performed, when the variable resistive element is in the low resistance state. On the other hand, as illustrated in FIG. 9, when the variable resistive element is in the high resistance state, the resistance greatly changes at a certain timing during the execution of the continuous reading action. Therefore, a reading disturb is caused, in which the variable resistive element is changed from the high resistance state to the low resistance state.

Similarly, a second reading action is performed, wherein a reading voltage pulse (−0.7 V, 100 nsec) having a polarity same as that of a writing voltage pulse (−1.6 V, 50 nsec) for writing the variable resistive element from the low resistance state to the high resistance state is continuously applied. FIGS. 10 and 11 show the reading disturb characteristics of the low resistance state and the high resistance state of the 5-bit variable resistive element in this case. FIG. 10 is a graph illustrating the number of times of the application of the reading voltage pulse and a change in the resistance value of the variable resistive element, when the reading voltage pulse is continuously applied without applying the writing voltage pulse in the case where the variable resistive element is in the low resistance state. FIG. 11 is a graph illustrating the number of times of the application of the reading voltage pulse and a change in the resistance value of the variable resistive element, when the reading voltage pulse is continuously applied without applying the writing voltage pulse in the case where the variable resistive element is in the high resistance state.

As shown in FIG. 10, as the reading action is continuously executed when the variable resistive element is in the low resistance state, the resistance value gradually increases, with the result that the reading disturb in which the variable resistive element is changed from the low resistance state to the high resistance state occurs. On the other hand, as shown in FIG. 11, a great resistance change is not generated even if the reading action is continuously performed, when the variable resistive element is in the high resistance state.

FIG. 12A corresponds to FIGS. 8 and 9, and illustrates the number of defective bits generated in the high resistance state and in the low resistance state after the first reading action is executed 100000 times. FIG. 12B corresponds to FIGS. 10 and 11, and illustrates the number of defective bits generated in the high resistance state and in the low resistance state after the second reading action is executed 100000 times.

As described above, the reading disturb in which the variable resistive element is changed to the low resistance state occurs, when the reading voltage having the polarity same as that of the writing voltage pulse for writing the variable resistive element from the high resistance state to the low resistance state is used. However, the variable resistive element is not changed to the high resistance state, and if there is an error in the read data, this error is limited to the case in which the bit that should be in the high resistance state becomes the low resistance state. Similarly, when the reading voltage pulse having the polarity same as that of the writing voltage pulse for writing the variable resistive element from the low resistance state to the high resistance state is used, the reading disturb in which the variable resistive element is changed to the high resistance state occurs. However, the variable resistive element is not changed to the low resistance state. If there is an error in the read data, this error is limited to the case in which the bit that should be in the low resistance state becomes the high resistance state. This means that the erroneous writing caused during the reading action is limited to the erroneous writing due to the application of the reading voltage pulse having the polarity opposite to that of the writing voltage pulse applied in the writing action just before the reading action.

The present invention utilizes this characteristic, and when an error is found in the error detection by the ECC, a process for determining the resistance state is skipped, and the correcting action of the variable resistive elements of all memory cells from which the error is found is executed by the application of the writing voltage pulse having the polarity opposite to that of the reading voltage pulse applied in the reading action, whereby the time taken for the correcting action can be remarkably shortened.

In order to achieve the foregoing object, according to a first aspect, a semiconductor memory device according to the present invention includes a memory cell array that includes a plurality of memory cells in a row direction and in a column direction, each of the memory cells including a variable resistive element having electrodes on both ends of a variable resistor, and a current limiting element connected to the electrode on one end of the variable resistive element, wherein a resistance state of the variable resistive element specified by a resistance characteristic between both ends is changed among two or more different resistance states due to application of an electric stress between both ends, and one of the resistance states after the change is used for storing information; and a control circuit that controls a coding action in which an error correction coding is performed to a plurality of information bits so as to generate coded data having a bit length longer than that of the plurality of information bits, a first writing action in which a writing voltage pulse having a first polarity is applied to the electrodes at both ends of the variable resistive element in the selected memory cell corresponding to a bit of a first logical value of the coded data so as to change the variable resistive element to a first resistance state, a second writing action in which a writing voltage pulse having a second polarity, which is opposite to the first polarity, is applied to the electrodes at both ends of the variable resistive element in the selected memory cell corresponding to a bit of a second logical value of the coded data so as to change the variable resistive element to a second resistance state, a reading action in which a reading voltage pulse having the first polarity is applied to the electrodes at both ends of the variable resistive elements in the plurality of selected memory cells corresponding to the coded data so as to read the resistance state of the selected memory cells as the coded data, and a decoding action in which an error in the coded data read by the reading action is detected and corrected, and the coded data is decoded, wherein, when an error in the coded data read in the decoding action is detected, the control circuit controls a correcting action, in which the memory cells corresponding to an error position of the error are selected, and the second writing action is executed to all of the memory cells corresponding to the error position, to the coded data stored in the memory cell array.

In the description below, the first logical value is defined as "0", and the second logical value is defined as "1". The high resistance state of the variable resistive element may be assigned to the logical value "0", and the low resistance state thereof may be assigned to the logical value "1". Alternatively, the low resistance state of the variable resistive element may be assigned to the logical value "0", and the high resistance state thereof may be assigned to the logical value "1". Hereinafter, the resistance state of the variable resistive element corresponding to the logical value "0" is appropriately referred to as "0" state, and the resistance state of the variable resistive element corresponding to the logical value "1" is referred to as "1" state.

In the present invention, during the reading action, the reading voltage pulse having the polarity same as that of the writing voltage pulse for writing the memory cell to the first logical value "0" is applied to read the coded data. In this case, as described above, the erroneous writing in which "0" is written to the bit that should have the logical value "1" might occur, but the erroneous writing in which "1" is written to the bit that should have the logical value "0" does not occur. Therefore, if an error is detected during the error detecting action after the decode of the coded data, the detected error is limited to the case in which the bit that should be the logical value "1" becomes "0".

Accordingly, when an error is detected, this error data is always estimated such that the bit that should be the logical value "1" becomes "0", without determining whether the error data is such that the bit that should be the logical value "0" becomes "1" or the error data is such that the bit that should be the logical value "1" becomes "0". Then, the second writing action for applying the writing voltage pulse, which is used to write the logical value "1" and which has a polarity opposite to the polarity of the reading voltage pulse is always executed to the variable resistive elements in all memory cells from which the error is detected. With this action, the correcting action can be realized. Consequently, the time taken for the correction of the coded data can be shortened.

Further, it is preferable in the semiconductor memory device according to the first aspect of the present invention that the first writing action is executed to all memory cells from which the error is detected, before the second writing action is executed, during the correcting action.

Before the writing voltage pulse for writing the logical value "1" is applied to the variable resistive elements of all memory cells from which the error is detected, the first writing action for applying the writing voltage pulse, which is used to write the logical value "0", is executed. With this process, the resistance state of the variable resistive element is written to the "1" state (second resistance state) after it is changed to the "0" state (first resistance state), so that the variable resistive element can more precisely be written to the "1" state.

Further, according to a second aspect, in the semiconductor memory device according to the first aspect of the present invention, when an error in the coded data read in the decoding action is detected, the control circuit controls the execution of a read/output action, in which the resistance states of the variable resistive elements of all of the memory cells corresponding to the error position are set to the second resistance state, and the decoded data after the error correction is outputted, in parallel with the execution of the correcting action.

According to the semiconductor memory device of the second aspect, when the error in the coded data is detected, the semiconductor memory device does not execute the action in which the coded data is corrected and again read, but outputs the decoded data having the corrected error data. With this process, the time that elapses before the data is outputted can be shortened, whereby the data output and error correction can be made with high speed.

The error that might occur in this case is limited to the error in which the bit that should be the logical value "1" becomes "0" as described above. Therefore, the logical value "1" (the logical value corresponding to the second resistance state) is always outputted with respect to the error data during the read/output action.

The read/output action and the correcting action can be executed in parallel by utilizing that the times required for the programming action, erasing action, and the reading action of the variable resistive element are several tens of nanoseconds to 100 nanoseconds and they are almost equal. Further, the semiconductor memory device does not make a user of the memory be aware of the time taken for the correction of the memory cell.

Further, in the semiconductor memory device according to the second aspect of the present invention, it is preferable that the execution of the read/output action is started with an action cycle equal to the second writing action in the correcting action.

Alternatively, in the semiconductor memory device according to the first aspect of the present invention, it is preferable that, when an error in the coded data read in the decoding action is detected, the control circuit controls the execution of a read/output action in which the resistance states of the variable resistive elements of all of the memory cells corresponding to the error position are set to the second resistance state, and the decoded data after the error correction is outputted, and the execution of the read/output action is started with an action cycle equal to the first writing action in the correcting action.

Specifically, when the action sequence of the read/output action and the correcting action is supposed to be controlled by the action cycle based upon the same control clock, the execution of the read/output action is preferably started at the timing same as that of the second writing action in the correcting action or the first writing action of the correcting action.

Further, according to a third aspect, in the semiconductor memory device according to the first and second aspects of the present invention, the memory cell array is divided into a plurality of banks, and the control circuit controls the execution of the correcting action and the read/output action with an action cycle in which, during the execution or simultaneously with the start of the execution of the correcting action to the memory cell in one of two different banks, the execution of the reading action to the memory cell in the other bank is started, or with an action cycle in which, during the execution or simultaneously with the end of the execution of the correcting action to the memory cell in one of the banks, the execution of the reading action to the memory cell in the other bank is ended.

In the semiconductor memory device according to the third aspect, the times required for the programming action, erasing action, and the reading action of the variable resistive element are several tens of nanoseconds to 100 nanoseconds and they are almost equal. By utilizing this, the reading action and the correcting action to the memory cell, which belongs to another bank, can be executed in parallel. Therefore, the semiconductor memory device can realize the reading method that does not make a user of the memory be aware of the time required for the correction of the memory cell.

Further, in the semiconductor memory device according to any one of the first to the third aspects of the present invention, it is preferable that the control circuit controls a coded data writing action in which one of the first writing action and the second writing action is executed to each of the plurality of selected memory cells so as to write the coded data to the selected memory cells; and when the reading action is executed immediately after the coded data writing action to the plurality of selected memory cells, and an error is detected in the coded data read in the subsequent decoding action, the control circuit controls a second correcting action in which, to each of the memory cells corresponding to the error position, the second writing action is executed when the resistance state of the variable resistive element of each of the memory cells is the first resistance state, and the first writing action is executed when the resistance state of the variable resistive element of each of the memory cells is the second resistance state.

As described above, in the present invention, when the error is detected in the reading action, it is estimated that the bit that should be the logical value "1" becomes "0". Based upon this estimation, the writing voltage pulse that is used for writing the logical value "1" and that has the polarity opposite to the polarity of the reading voltage pulse is applied for performing the correcting action. However, in the reading action (verifying action) just after the data writing action of the memory cell, it is considered that the detected error is caused by the reading disturb or caused by the failure in writing. When the device fails to write data, both cases are considered, which are the case in which the bit to which the logical value "1" should be written becomes "0", and the case in which the bit to which the logical value "0" should be written becomes "1". Therefore, it is impossible to simplify the correcting action on the assumption that the bit to which the logical value "1" should be written becomes "0". Accordingly, the correcting action (second correcting action) for writing "0" when the error data is "1", and for writing "1" when the error data is "0" is necessary depending on the read data.

Further, in the semiconductor memory device according to any one of the first to the third aspects of the present invention, it is preferable that the variable resistor contains oxides or nitrided oxides of at least one of metals including Al, Hf, Ni, Co, Ta, Zr, W, Ti, Cu, V, Zn, and Nb.

Therefore, according to the present invention, there can be provided a semiconductor memory device that can efficiently perform the detection of an error in data that might possibly occur in the continuous reading action, and the correction of the error data.

DESCRIPTION OF THE PREFERRED EMBODIMENTS

First Embodiment

Figure 1:
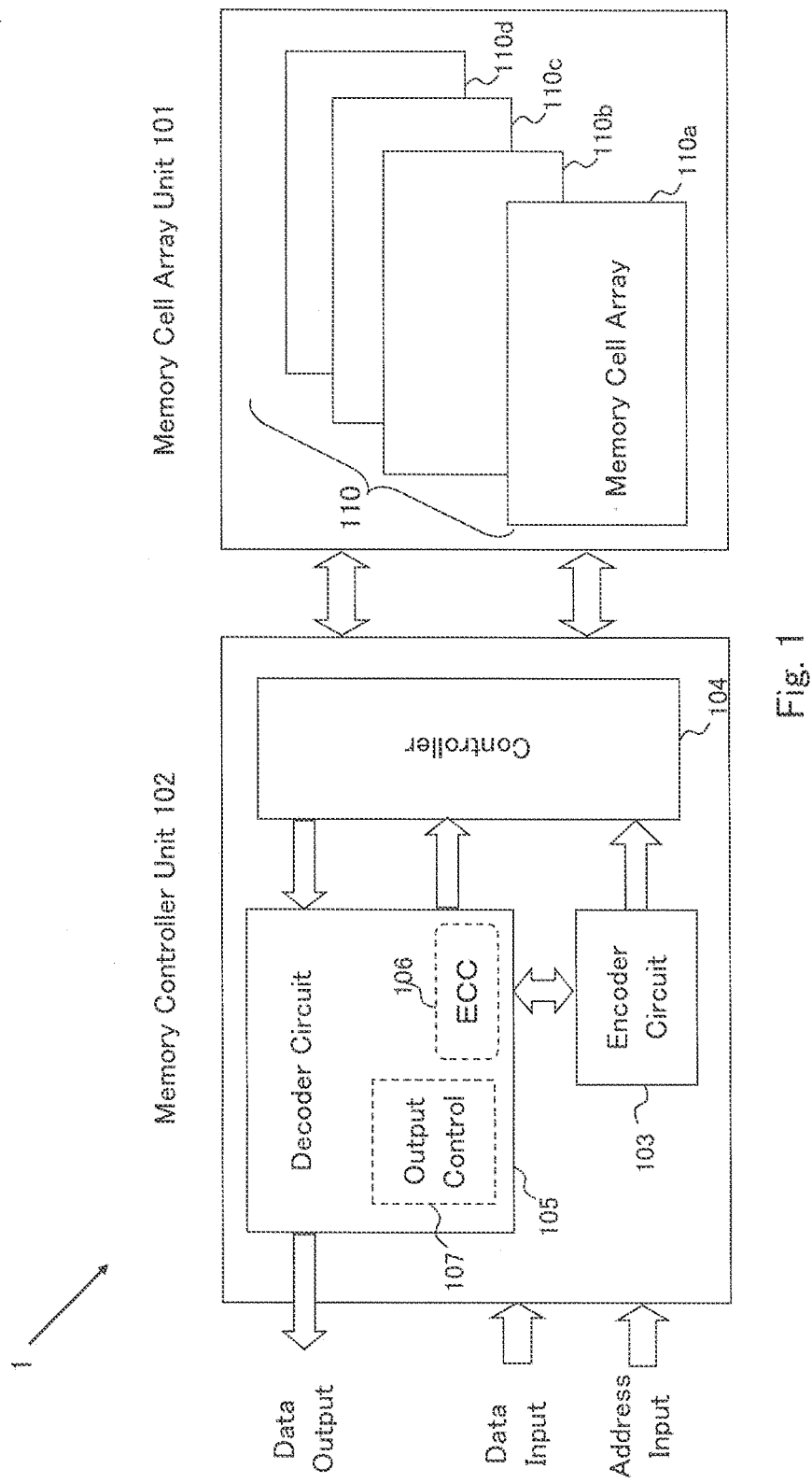
FIG. 1 is a block diagram showing one example of a configuration of a semiconductor memory device according to the present invention.

FIG. 1 shows a schematic circuit structure of a semiconductor memory device (hereinafter appropriately referred to as "present device 1") according to one embodiment of the present invention. The present device 1 basically includes a memory cell array unit 101, and a memory controller unit 102. The memory controller unit 102 includes an encoder circuit 103 that performs error-correction coding for adding an error-correction check bit to a plurality of information bits, which are input data, and generates coded data having a bit length longer than that of the information bit; a controller 104 that controls a writing action and a reading action of the coded data to a memory cell in the memory cell array in the memory cell array unit 101 specified by an input address; and a decoder circuit 105 that decodes the coded data (information bit+check bit) read through the controller 104, detects whether the decoded data has an error or not, and corrects the error. The decoder circuit 105 includes therein an ECC circuit 106 that specifies an error bit position when the error is detected in the decoded data; and an output control circuit 107 that outputs a normal bit as is, and outputs the error bit with the data being inverted.

The controller 104 controls not only the writing and reading action, but also respective actions of the encoder circuit 103, the decoder circuit 105, the ECC circuit 106, and the output control circuit 107. Although not shown in FIG. 1, the memory cell array unit 101 includes a column selecting circuit and a row selecting circuit, which are used to select a specific memory cell that is a target of the action, during the writing and reading action; and a circuit that supplies an operating voltage for the writing and reading action, and applies the operating voltage to the selected specific memory cell.

Figure 2:
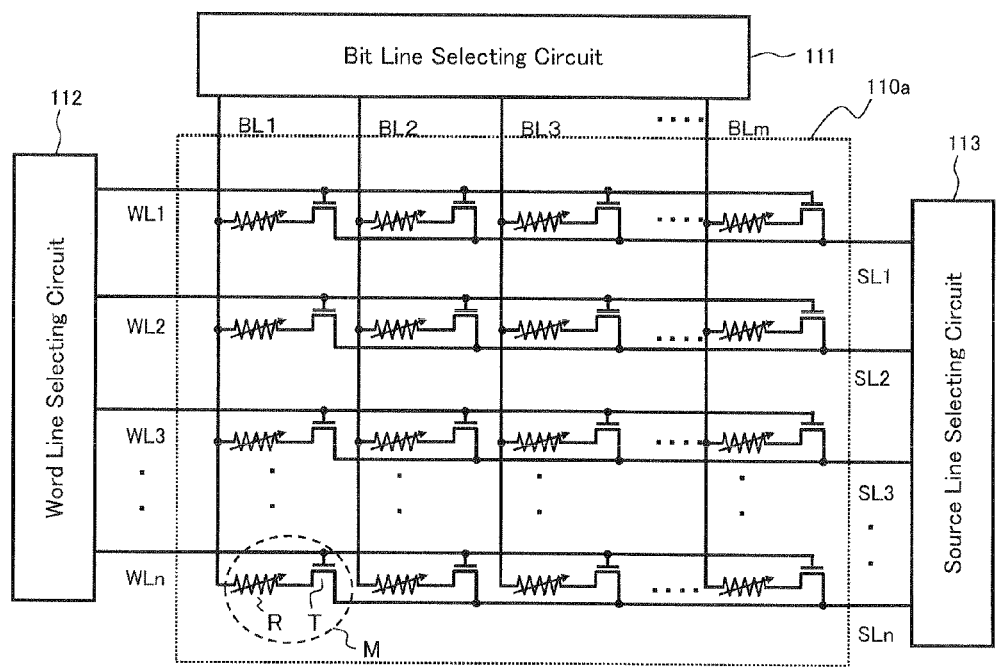
FIG. 2 is a circuit diagram showing one example of a configuration of a memory cell array forming the semiconductor memory device according to the present invention.

The memory cell array unit 101 includes the memory cell array 110, wherein the memory cell array 110 is divided into a plurality of (e.g., 4) banks 110a to 110d. FIG. 2 shows an example of a configuration of each bank forming the memory cell array. Each bank includes a plurality of memory cells M, each memory cell M including one transistor T and one variable resistive element R, wherein one end of a source or drain of the transistor T and one end of the variable resistive element R are connected to each other.

In each of the banks 110a to 110d, m×n memory cells M are arranged in a matrix in the row direction (lateral direction in FIG. 2) and in the column direction (longitudinal direction in FIG. 2). In the individual memory cell M, the other end of the variable resistive element of each of the memory cells arranged in the same column is connected to a bit line BLi (i=1 to m) extending in the column direction, while a word line WLj=1 to n) extending in the row direction is connected to a gate of the transistor of each of the memory cells arranged in the same row. On the other hand, the other end of the source or drain of the transistor of each of the memory cells arranged in the same column is connected to a source line SLk (k=1 to n) extending in the column direction. The source lines SLk may extend in the row direction, or all source lines in the memory cell array may be shared. The structure thereof is not particularly limited. In the present embodiment, each of the banks 110a to 110d is configured to change a selected state and a non-selected state of the memory cell M depending on the application state of the gate voltage of the transistor T, and to change the action of the memory cell M depending on the voltage application state to one end of the variable resistive element R and the other end of the source or drain of the transistor T.

Each of the bit lines BLi is connected to a bit line selecting circuit (column selecting circuit) 111, and each of the word lines WLj is connected to a word line selecting circuit (row selecting circuit) 112. Each of the source lines SLk is connected to a source line selecting circuit 113. When the address of the memory cell that is the target of the action is inputted, the memory controller unit 102 specifies the bank to which the target memory cell belongs. Each of the selecting circuits 111 to 113 selects a bit line, word line, and source line of the specified bank in accordance with the address input based upon the instruction from the memory controller unit 102, and individually applies voltages required for the memory action to the selected or non-selected bit line, word line, and source line, respectively.

Each of the banks 110a to 110d may be configured such that the bit line and the word line are different, and the memory cell is independently selected by the word line selecting circuit 112 and the bit line selecting circuit 111. Alternatively, each of the banks 110a to 110d may be configured such that the word line is shared at least between two banks, and the memory cell is selected by the common word line selecting circuit 112. With this configuration, the memory action of the selected memory cell can independently be made for each bank. When the word line is shared between the banks, it is impossible that the memory cells having the different word lines are selected between the banks, and the memory actions are independently made for these memory cells. However, for the memory cells connected to the same word lines between the banks, the memory actions can independently be made for these memory cells.

The variable resistive element R is an element that carries electrodes on both ends of a variable resistor made of a metal oxide. Examples of the material for the variable resistor include oxides and nitrided oxides of Al, Hf, Ni, Co, Ta, Zr, W, Ti, Cu, V, Zn, and Nb.

As for the material of the electrodes supporting the variable resistor, a material having a large work function (e.g., TiN, Pt, Ir) is used for one electrode to form a first electrode, while a material (e.g., Ta, Al) having a work function equal to an impurity level due to an oxygen loss of the metal oxide is used for the other electrode to form a second electrode. More preferably, a material having a work function of 4.5 eV or more is used as the first electrode, and a material having a work function of 4.5 V or less is used as the second electrode. In this case, the interface between the second electrode and the metal oxide becomes an ohmic junction, and the interface between the first electrode and the metal oxide becomes a non-ohmic junction (schottky junction).

In order to change the variable resistive element R from a high resistance state to a low resistance state, a voltage pulse of +1.8 V and 50 nsec is applied to between the bit line and the source line of the memory cell, for example. On the other hand, in order to change the variable resistive element R from the low resistance state to the high resistance state, a voltage pulse of −1.6 V and 50 nsec having a polarity opposite to that for changing the variable resistive element to the low resistance state is applied to between the bit line and the source line of the memory cell, for example. Here, the low resistance state of the variable resistive element R is set as a logical value "0", and the high resistance state thereof is set as a logical value "1". For convenience sake, the resistance state (high resistance state) of the variable resistive element corresponding to the logical value "0" is referred to as "0" state (erase state), and the resistance state (low resistance state) of the variable resistive element corresponding to the logical value "1" is referred to as "1" state (program state). An action of writing the "0" state to the variable resistive element R of the selected memory cell is referred to as a first writing action, and an action of writing the "1" state is referred to as a second writing action. In this case, it can be configured such that a voltage pulse of +1.8 V and 50 nsec is applied from the selected bit line with 0 V being applied to the source line, in order to execute the first writing action, and a voltage pulse of 0 V and 50 nsec is applied from the selected bit line with 1.6 V being applied to the source line, in order to execute the second writing action.

In this case, the resistance state of the variable resistive element R can be written by controlling the applied voltage or electric current. Since it is unnecessary to adjust the number of times and applying time of the voltage pulse applied to the variable resistive element every time different information is stored, a complicated algorithm is not required.

Various known methods can be employed for the error-correction coding method used in the present device 1. For example, a cyclic code such as Reed-Solomon coding or Bose-Chaudhuri-Hocquenghem (BCH) coding, hamming code, or low density parity check code (LDPC) can be employed, but the invention is not limited thereto.

In the present device 1, the data that is to be stored in the memory cell array 110 undergoes the error-correction coding for each of the plurality of information bits by the encoder circuit 103, and the coded data to which the check bit is added is stored in the memory cell array. Therefore, when the data stored in the memory cell array is read, the information of a plurality of memory cells has to be collectively read in coded data basis.

The action of reading the coded data by the present device 1 will be described with reference to a flowchart in FIG. 3.

Firstly, the address of the memory cell, which is the target of the reading action, is inputted to the memory controller unit 102 (step #200).

The controller 104 in the memory controller unit 102 specifies the plurality of memory cells corresponding to the input address, and reads the resistance state of the variable resistive element of each of the plurality of memory cells so as to read the coded data (step #201: reading action). Preferably, memory cells the number of which corresponds to the bit number of the coded data are selected out of the plurality of memory cells connected to the same word line with the input address being defined as a start address, and a reading voltage is simultaneously applied to the plurality of bit lines connected to the selected memory cells. The reading voltage in this case is set as a voltage (e.g., 0.3 V) lower than the writing voltage pulse in the first writing action, and the reading voltage has a reading voltage pulse having a polarity same as that of the writing voltage pulse in the first writing action. Specifically, the reading voltage pulse is set so as to have the polarity same as the polarity when the "0" state is written in the variable resistive element R. In this case, the error detected by the decoder circuit 105 is limited to the case in which the element that should be in the "1" state becomes the "0" state.

Any voltage may be used as the reading voltage, so long as the absolute value of the voltage amplitude of the reading voltage pulse is smaller than that of the writing voltage pulse in the first writing voltage action, and the voltage does not greatly vary the resistance value of the variable resistive element due to factors other than the influence of the reading disturb.

Next, the decoder circuit 105 decodes the read coded data (step #202: decoding action).

The decoder circuit 105 then detects whether there is an error in the decoded data or not based upon the error-correction code (step #203: error detecting action). When an error is detected, the ECC circuit 104 specifies the address having the data error based upon the error-correction code.

When the data error is detected in step #203, the writing voltage pulse is applied to the variable resistive element of the memory cell on the address where the error is detected, in order to correct the error in the coded data (step #204: correcting action). Since the error is limited to the case where the bit that should be "1" becomes "0", the writing voltage pulse for writing the variable resistive elements to the "1" state may be applied to all memory cells from which the error is detected. Specifically, only the second writing action needs to be executed to all memory cells from which the error is detected.

In this case, the first writing action is executed before the second writing action is executed, in order that the resistance state of the variable resistive element of the memory cell from which the error is detected is temporarily changed to the "0" state, and then, changed to the "1" state. With this action, the error correction of the variable resistive element can more correctly be made.

For the correcting action in the case where the error is detected based upon the error-correction code, a flash memory, which is popularly used as a non-volatile memory nowadays, requires several milliseconds for the erasing action, and several microseconds even for the programming action. Further, for the correction, it is necessary that the error data, i.e., a certain block having a plurality of elements including the elements whose resistance is changed, is once erased at a time, and then, all elements in the block are rewritten. Consequently, it takes time for the correction of the error data. While the block including the error data is rewritten, the data cannot be read by the access to the block. Therefore, the reading speed is reduced.

On the other hand, the present device 1 is excellent in random accessibility, and can make the writing and reading actions with a very high speed (100 ns or less) compared to the flash memory. Therefore, the error can be corrected on a variable-resistive-element basis, whereby the reduction in the reading speed can be prevented.

Second Embodiment

As described above, when the read data is decoded, and the error data is detected, the present device 1 executes the second writing action to the error data in the memory cell array based upon the error-correction code, thereby being capable of correcting the error with a high speed. However, it takes time to actually output true data after the detection of the error data. This is because the true data is outputted after the action in which the writing action is performed to correct the error data in the memory cell array, and then, the reading action is performed again, and the reading action, the decoding action, and the error correcting action are repeated until the error data is eliminated.

However, when the error data is detected, an error bit is specified out of the read data based upon the error-correction code, and the output control circuit 107 inverts the data of the error bit in the read data so as to output the true data. With this process, a high-speed data reading action can be realized.

Figure 4:
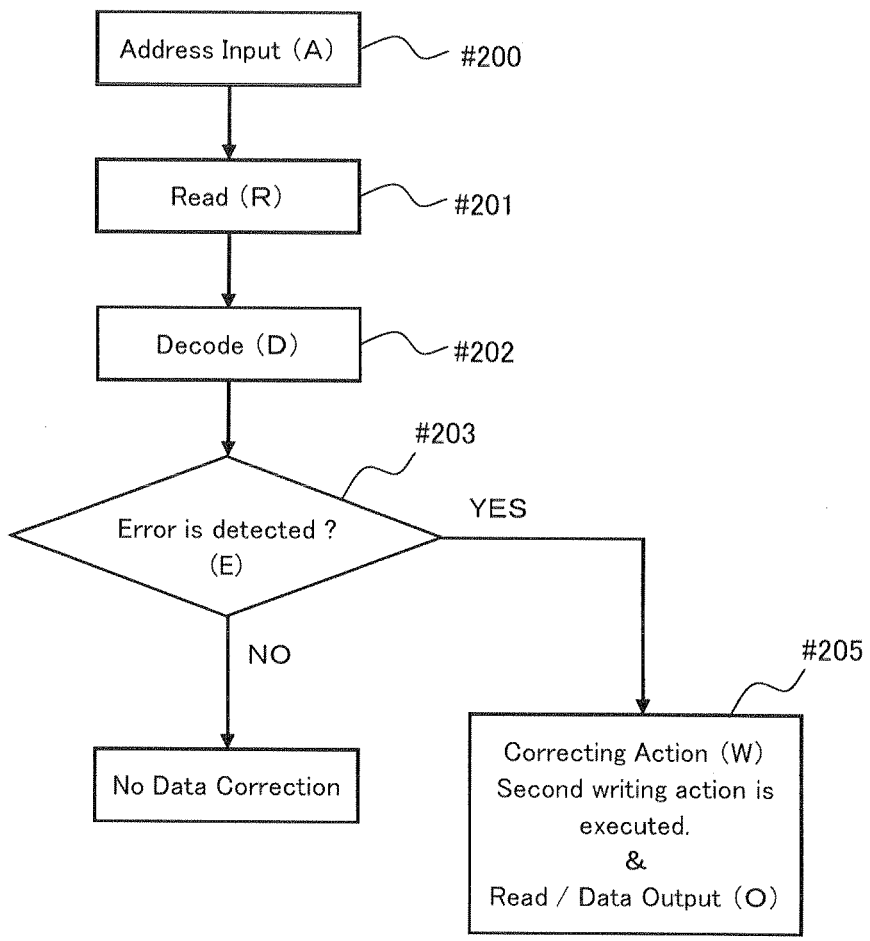
FIG. 4 is a flowchart showing the action of reading coded data of the semiconductor memory device according to the present invention.

The data reading action of the present device 1 in this case will be described with reference to a flowchart in FIG. 4.

Figure 3:
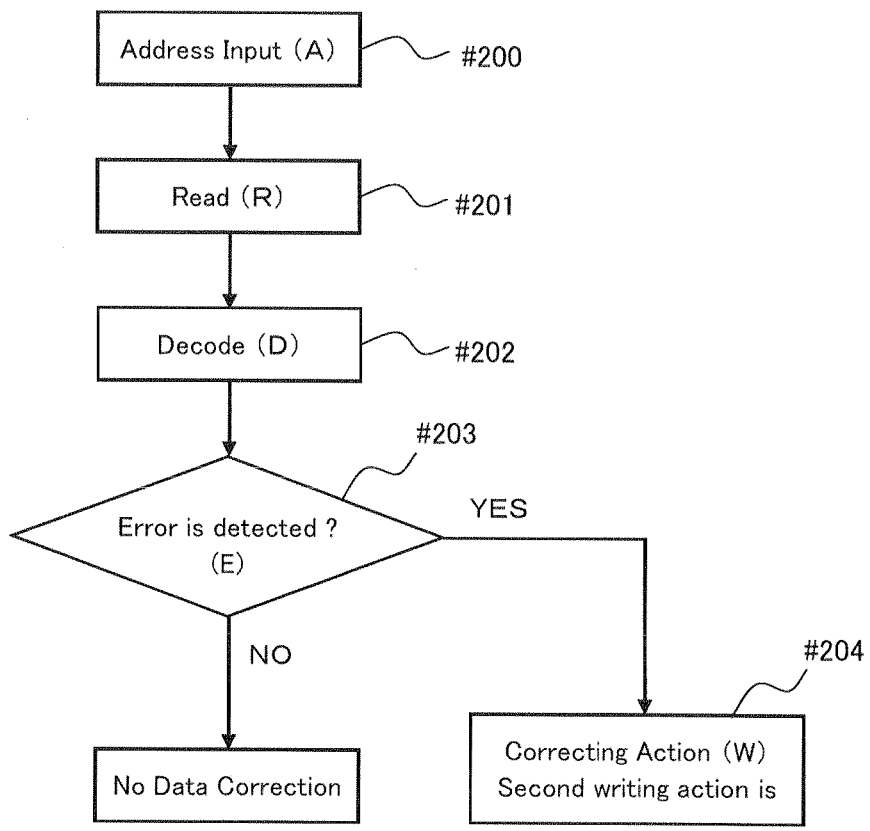
FIG. 3 is a flowchart showing an action of reading coded data of the semiconductor memory device according to the present invention.

Step #201 (reading action), step #202 (decoding action), and step #203 (error correcting action) are the same as those described in FIG. 3, so that the description will not be repeated.

When the data error is detected in step #203, a second writing voltage pulse is applied to the variable resistive element of the memory cell on the address where the error is detected so as to perform the correcting action for correcting the data error, and in parallel with the correcting action, the output control circuit 107 inverts the data of the error bit in the read data so as to output the true data, in next step #205. Since the data error is limited to the case where the bit that should be "1" becomes "0", the output control circuit 107 performs an action of outputting "1" with respect to all error bits (read/output action).

During the execution of the read/output action, a new reading action is not performed at least for the memory cell in the same bank. Therefore, when the error correcting action is executed during the execution of the read/output action, a data reading action with higher speed can be realized.

Third Embodiment

Figure 5:
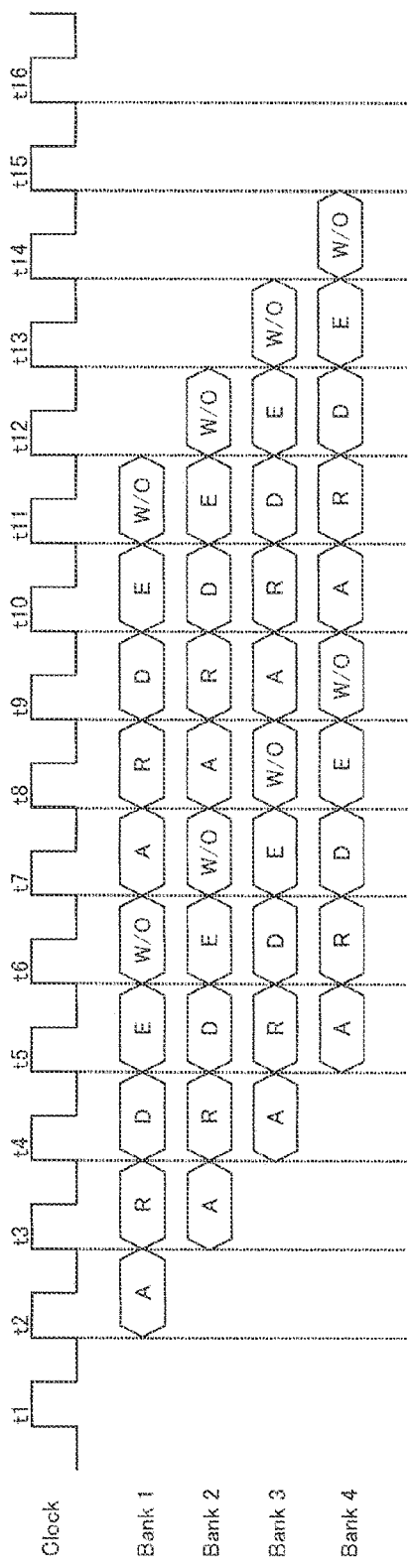
FIG. 5 is a timing chart showing the reading action of the semiconductor memory device according to the present invention.

FIG. 5 shows a timing chart of the reading action in the present device 1 provided with a plurality of banks. In FIG. 5, when the data stored in the memory cell array 110 is outputted, a sequence including five actions, which are an address input (A), a reading action (R), a decoding action (D), an error detecting action (E), and a correction and read/output action (W/O), is performed as one cycle each in the action cycle of a control clock. The respective action sequences correspond to the respective actions in steps #200 to #203, and #205 in FIG. 4.

In FIG. 5, in the respective action cycles t1 to t16, each action is ended with one clock of the control clock. However, there may be the case in which a plurality of clocks of the control clock are required for each action. In this case, the time interval of each of the action cycles t1 to t16 in FIG. 5 is determined by the maximum number of the control clocks required for each action, and the time intervals of the action cycles t1 to t16 are the same. In FIG. 5, in order to simplify the description, a plurality of control clocks included in each action cycle are collectively described as one clock. In FIG. 5, it is supposed that each of the action cycles t1 to t16 starts at the rising timing of the clock illustrated in FIG. 5, and the starting time of each action cycle ti (i=1 to 16) is referred to as ti. This is similarly applied to timing charts shown in FIGS. 6 and 7.

When the reading address to the bank 1 is designated in the action cycle t2, the reading action (step #201) is performed to a plurality of memory cells, which are specified based upon the reading address, so as to read the coded data in the action cycle t3.

On the other hand, when the reading address to the bank 2 is designated in the action cycle t3, the reading action (step #201) is performed to the plurality of memory cells, which are specified based upon the reading address, so as to read the coded data in the action cycle t4. In this case, the decoding action (step #202) of the data read in the bank 1 is executed in parallel with the reading action in the bank 2.

On the other hand, when the reading address to the bank 3 is designated in the action cycle t4, the reading action (step #201) is performed to the plurality of memory cells, which are specified based upon the reading address, so as to read the coded data in the action cycle t5. In this case, the error detection action (step #203) in the bank 1 and the decoding action (step #202) of the data read in the bank 2 are executed in parallel with the reading action in the bank 3.

On the other hand, when the reading address to the bank 4 is designated in the action cycle t5, the reading action (step #201) is performed to the plurality of memory cells, which are specified based upon the reading address, so as to read the coded data in the action cycle t6. In this case, the correction and read/output action (step #205) in the bank 1, the error detecting action (step #203) in the bank 2, and the decoding action (step #202) of the data read in the bank 3 are executed in parallel with the reading action in the bank 4.

In this case, the correcting action in the bank 1 and the reading action in the bank 4 are actions in different banks, so that they can simultaneously be executed. Therefore, the respective actions are performed in parallel, whereby the data stored in the plurality of banks can efficiently be read.

This is similarly applied to the subsequent action cycles. The reading action in the bank 1 and the correcting action in the bank 3 can simultaneously be executed in the action cycle t8, the reading action in the bank 2 and the correcting action in the bank 4 can simultaneously be executed in the action cycle t9, and the reading action in the bank 4 and the correcting action in the bank 1 can simultaneously be executed in the action cycle t11.

In FIG. 5, the action sequence including five actions, which are the input of the address (A), the reading action (R), the decoding action (D), the error detecting action (E), and the correction and read/output action (W/O), is performed. However, the sequence can be added within a range where the actions of the banks are not overlapped in the same cycle.

Figure 6:
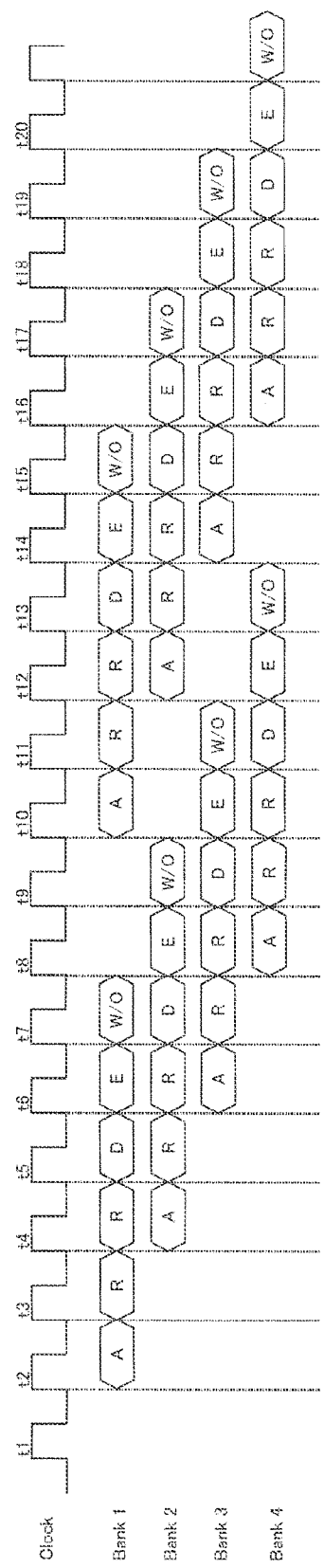
FIG. 6 is a timing chart showing the reading action of the semiconductor memory device according to the present invention.

FIG. 6 is another timing chart of the reading action in the present device 1. FIG. 6 shows the case in which two action cycles are required to complete the reading of the coded data because the number of bits in the coded data is large. Even in this case, in the correcting action (W), the second writing action may only be performed to the memory cell of not more than several bits, from which the error is detected. Accordingly, the correcting action can be finished in one action cycle. In the action cycles t7, t9, t11, t13, t15, and t17, the reading action (R) and the correcting action (W) are executed in parallel in the different banks.

Figure 7:
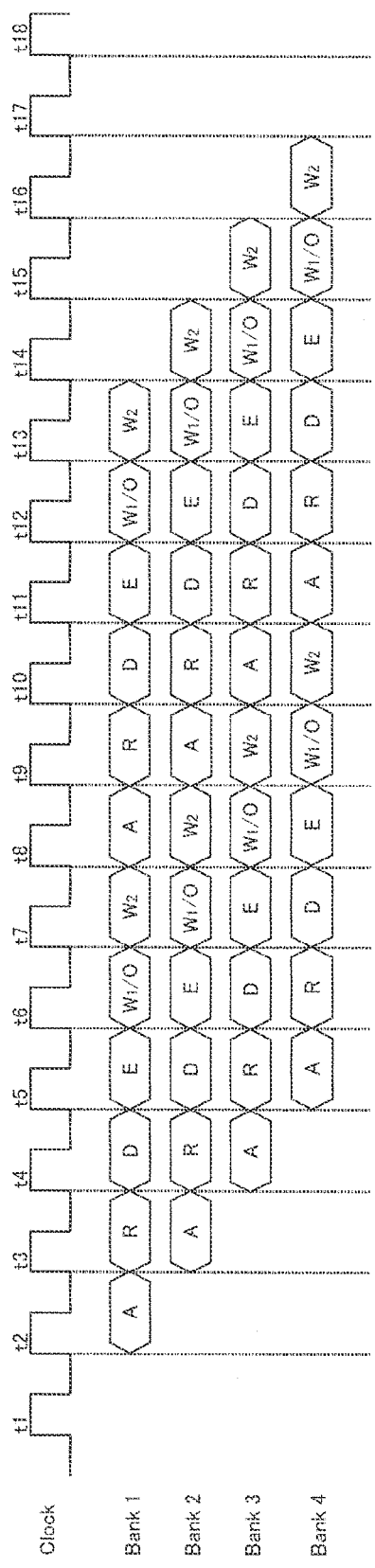
FIG. 7 is a timing chart showing the reading action of the semiconductor memory device according to the present invention.
Figure 8:
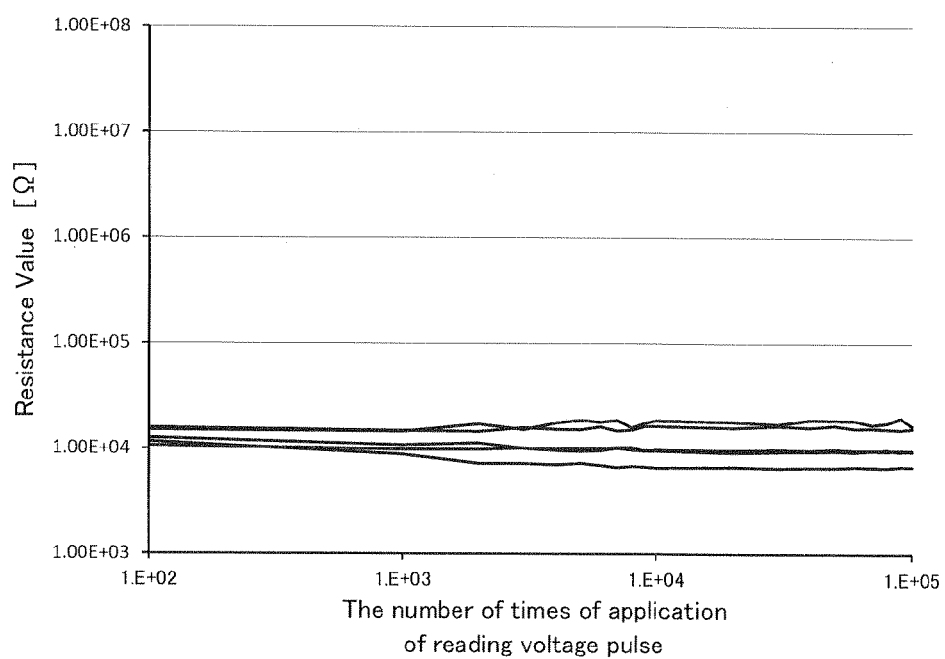
FIG. 8 is a graph showing a reading disturb characteristic of a variable resistive element, made of a metal oxide, in a low resistance state.
Figure 9:
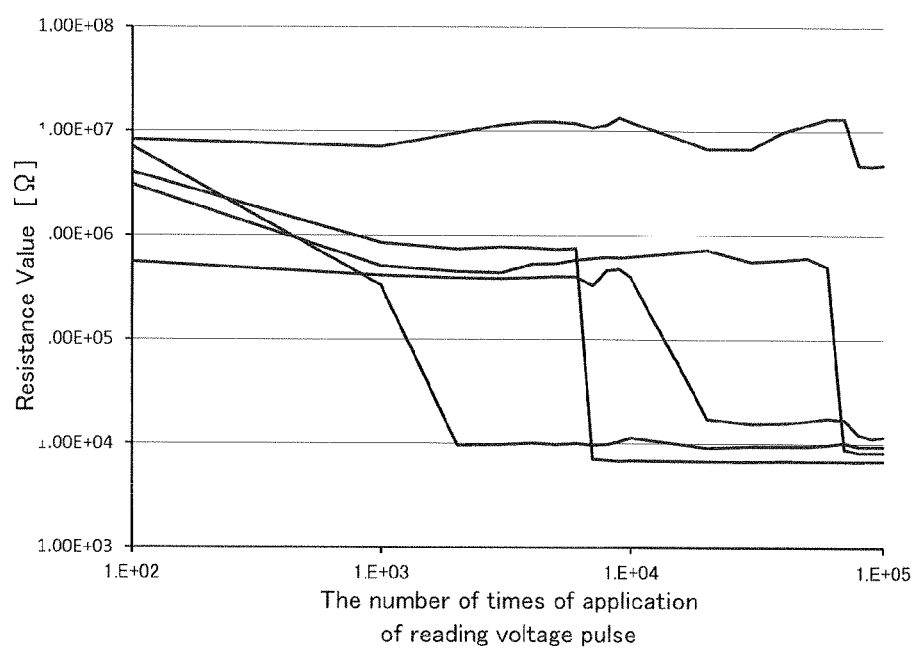
FIG. 9 is a graph showing a reading disturb characteristic of the variable resistive element, made of a metal oxide, in a high resistance state.
Figure 10:
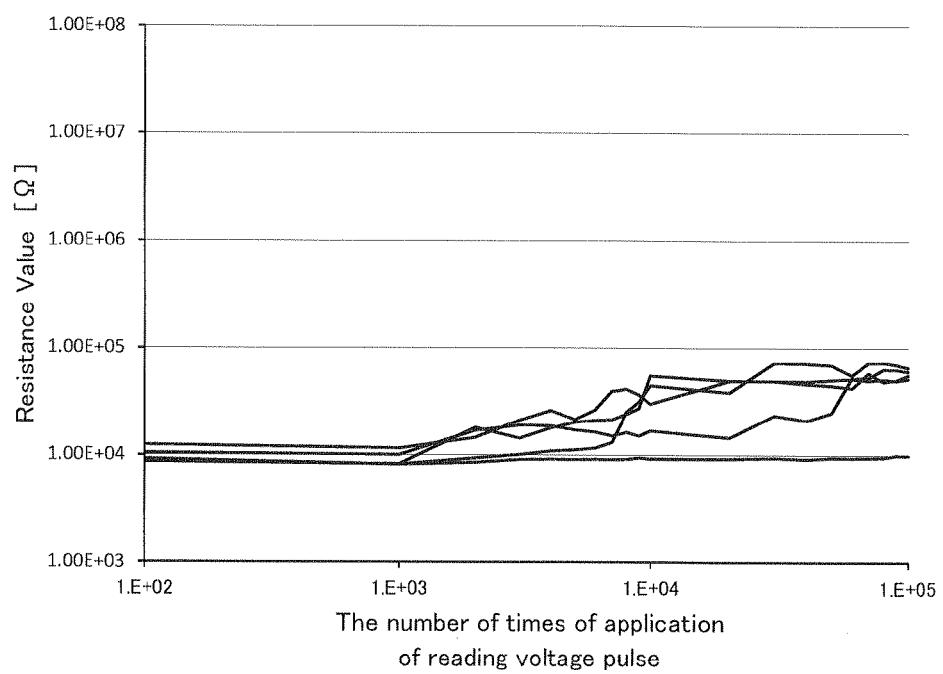
FIG. 10 is another graph showing a reading disturb characteristic of a variable resistive element, made of a metal oxide, in a low resistance state.
Figure 11:
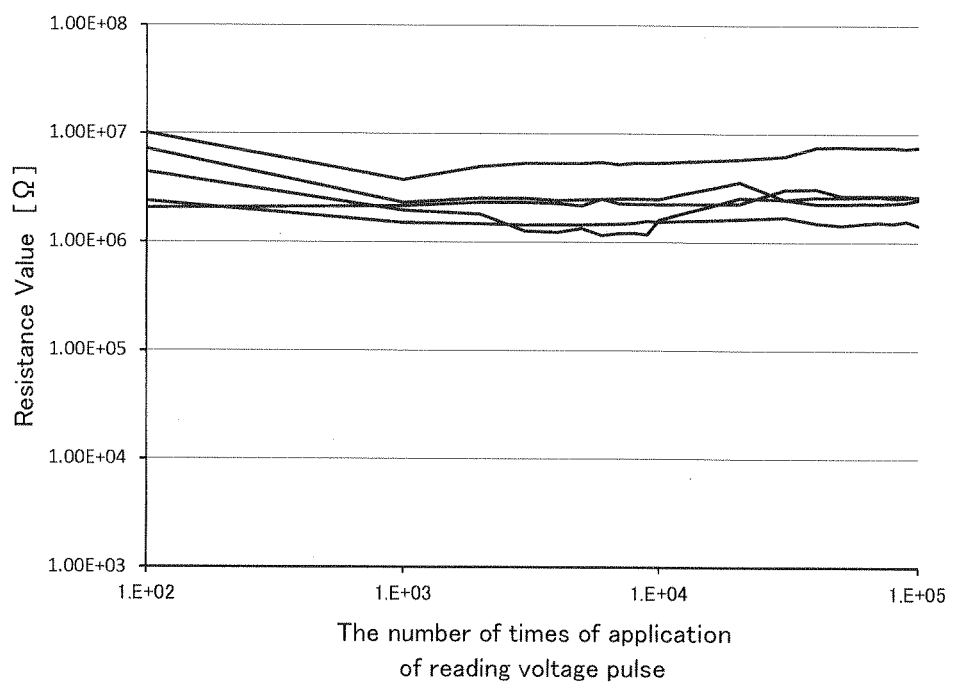
FIG. 11 is another graph showing a reading disturb characteristic of the variable resistive element, made of a metal oxide, in a high resistance state.
Figure 12A:
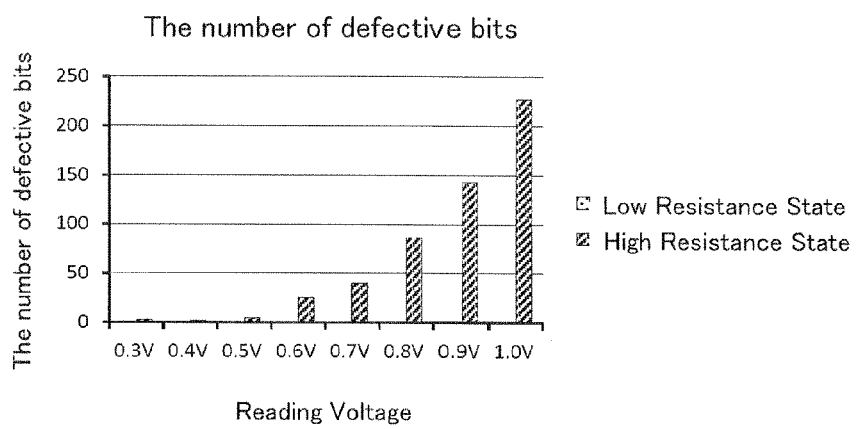
FIGS. 12A and 12B are views each showing a relationship between a magnitude of a reading voltage in the reading action and the number of defective bits.
Figure 12B:
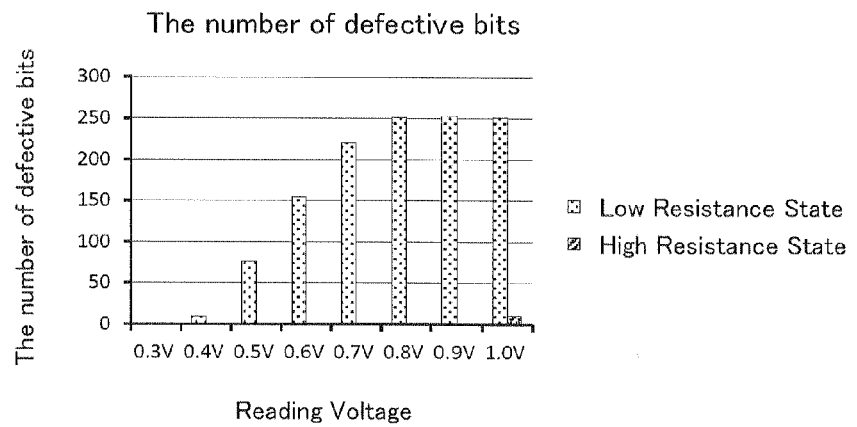

FIG. 7 is another timing chart of the reading action in the present device 1. FIG. 7 shows the case in which, in the correcting action (W), the first writing action (W1) is executed before the second writing action (W2), and one action cycle is required for each of the respective writing actions. In this case, when the banks that are the targets to be written are different, the application (W1) of the first writing pulse and the application (W2) of the second writing pulse can simultaneously be performed. Accordingly, in the action cycle t9 in FIG. 7, the reading action in the bank 1, the application (W2) of the second writing pulse in the correcting action in the bank 3, and the application (W1) of the first writing pulse in the correcting action in the bank 4 are simultaneously executed.

In FIG. 7, the read/output action (O) is executed simultaneously with the application (W1) of the first writing pulse in the correcting action. However, it may be executed simultaneously with the application (W2) of the second writing pulse in the correcting action.

Other embodiments of the present invention will be described below.

(1) In the above-mentioned embodiments, the memory cell array 110 includes four banks 110a to 110d. However, the present invention is not limited thereto. The number of the banks can appropriately be increased or decreased according to an object or required performance.

(2) The configuration of the memory cell array in each of the banks 110a to 110d is not limited to the circuit structure illustrated in FIG. 2. The present invention is not particularly limited by the circuit structure, so long as the memory cell array is formed by connecting memory cells, including the variable resistive element and the current limiting element, by use of the bit lines and word lines. In FIG. 2, a transistor is used as the current limiting element. However, an element (e.g., diode) other than the transistor can be used, so long as it can limit electric current flowing through the variable resistive element. In the present embodiment, one end, which is not connected to the transistor, of the variable resistive element is connected to the bit line. However, one end, which is not connected to the transistor, of the variable resistive element may be connected to the source line. The present invention is applicable to an optional memory cell array that includes a desired number of memory cells, each having a variable resistive element made of a metal oxide.

(3) In the embodiments described above, when the reading action is performed by applying the pulse, having the polarity same as that of the writing voltage pulse, for changing the variable resistive element to the low resistance state, the writing voltage pulse, which has a polarity opposite to that of the reading voltage pulse, for changing the variable resistive element to the high resistance state is applied to the variable resistive elements of all memory cells from which an error is detected in the error correcting action, on the assumption that the bit which should be "1" (high resistance state) becomes "0" (low resistance state). On the other hand, when the reading action is performed by applying the pulse having the polarity same as that of the writing voltage pulse for changing the variable resistive element to the high resistance state, the error that should be detected is limited to the error where the bit that should be "0" (low resistance state) becomes "1" (high resistance state). Therefore, in the error correcting action, the writing voltage pulse, having the polarity opposite to that of the reading voltage pulse, for changing the variable resistive element to the low resistance state is applied to the variable resistive elements of all memory cells from which the error is detected.

(4) In the embodiments described above, the voltage value and the pulse width of the voltage pulse used in the description of the reading action, the first writing action, and the second writing action are specific examples for describing the present invention, and they do not limit the property of the variable resistive element.

(5) In the embodiments described above, the case where the memory controller unit 102 controls the reading of each bank according to the timing charts in FIGS. 5 to 7 will be described in detail. However, the action control method according to the present invention is not limited to the actions shown in the timing charts.

The present invention can be utilized for a semiconductor memory device. Particularly, the present invention is applicable to a non-volatile semiconductor memory device provided with a variable resistive element whose resistance state is changed due to application of an electric stress, wherein the changed resistance state is used for storing information.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device comprising:
a memory cell array that includes a plurality of memory cells in a row direction and in a column direction, each of the memory cells including a variable resistive element having electrodes on both ends of a variable resistor, and a current limiting element connected to the electrode on one end of the variable resistive element, wherein a resistance state of the variable resistive element specified by a resistance characteristic between both ends is changed among two or more different resistance states due to application of an electric stress between both ends, and one of the resistance states after the change is used for storing information; and
a control circuit that controls
a coding action in which an error correction coding is performed to a plurality of information bits so as to generate coded data having a bit length longer than that of the plurality of information bits,
a first writing action in which a writing voltage pulse having a first polarity is applied to the electrodes at both ends of the variable resistive element in the selected memory cell corresponding to a bit of a first logical value of the coded data so as to change the variable resistive element to a first resistance state,
a second writing action in which a writing voltage pulse having a second polarity, which is opposite to the first polarity, is applied to the electrodes at both ends of the variable resistive element in the selected memory cell corresponding to a bit of a second logical value of the coded data so as to change the variable resistive element to a second resistance state,
a reading action in which a reading voltage pulse having the first polarity is applied to the electrodes at both ends of the variable resistive element in the plurality of selected memory cells corresponding to the coded data so as to read the resistance state of the selected memory cells as the coded data, and
a decoding action in which an error in the coded data read by the reading action is detected and corrected, and the coded data is decoded, wherein
when an error in the coded data read in the decoding action is detected, the control circuit controls a correcting action, in which the memory cells corresponding to an error position of the error are selected, and the second writing action is executed to all of the memory cells corresponding to the error position, to the coded data stored in the memory cell array.

2. The semiconductor memory device according to claim 1, wherein
the first writing action is executed to all of the memory cells corresponding to the error position, before the second writing action is executed, during the correcting action.

3. The semiconductor memory device according to claim, wherein
when an error in the coded data read in the decoding action is detected, the control circuit controls execution of a read/output action in which the resistance states of the variable resistive elements of all of the memory cells corresponding to the error position are set to the second resistance state, and the decoded data after error correction is outputted, and
execution of the read/output action is started with an action cycle equal to the first writing action in the correcting action.

4. The semiconductor memory device according to claim 1, wherein when an error in the coded data read in the decoding action is detected, the control circuit controls execution of a read/output action, in which the resistance states of the variable resistive elements of all of the memory cells corresponding to the error position are set to the second resistance state, and the decoded data after error correction is outputted, in parallel with execution of the correcting action.

5. The semiconductor memory device according to claim 4, wherein execution of the read/output action is started with an action cycle equal to the second writing action in the correcting action.

6. The semiconductor memory device according to claim 1, wherein the memory cell array is divided into a plurality of banks, and the control circuit controls execution of the correcting action and the read/output action with an action cycle in which, during execution or simultaneously with start of the execution of the correcting action to the memory cell in one of two different banks, execution of the reading action to the memory cell in the other bank is started, or with an action cycle in which, during the execution or simultaneously with end of the execution of the correcting action to the memory cell in one of the banks, the execution of the reading action to the memory cell in the other bank is ended.

7. The semiconductor memory device according to claim 1, wherein the control circuit controls a coded data writing action in which one of the first writing action and the second writing action is executed to each of the plurality of selected memory cells so as to write the coded data to the selected memory cells; and when the reading action is executed immediately after the coded data writing action to the plurality of selected memory cells, and an error is detected in the coded data read in the subsequent decoding action, the control circuit controls a second correcting action in which, to each of the memory cells corresponding to the error position, the second writing action is executed when the resistance state of the variable resistive element of each of the memory cells is the first resistance state, and the first writing action is executed when the resistance state of the variable resistive element of each of the memory cells is the second resistance state.

8. The semiconductor memory device according to claim 1, wherein the variable resistor contains oxides or nitrided oxides of at least one of metals including Al, Hf, Ni, Co, Ta, Zr, W, Ti, Cu, V, Zn, and Nb.

* * * * *